United States Patent
Okura et al.

(10) Patent No.: US 9,716,851 B2
(45) Date of Patent: Jul. 25, 2017

(54) SEMICONDUCTOR DEVICE

(71) Applicant: RENESAS ELECTRONICS CORPORATION, Kanagawa (JP)

(72) Inventors: Shunsuke Okura, Kanagawa (JP); Fukashi Morishita, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 269 days.

(21) Appl. No.: 14/691,848

(22) Filed: Apr. 21, 2015

(65) Prior Publication Data
US 2015/0312506 A1    Oct. 29, 2015

(30) Foreign Application Priority Data

Apr. 23, 2014  (JP) ................................ 2014-089251

(51) Int. Cl.
*H04N 5/3745*    (2011.01)
*H01L 27/146*    (2006.01)
*H04N 5/378*     (2011.01)

(52) U.S. Cl.
CPC ... *H04N 5/37457* (2013.01); *H01L 27/14641* (2013.01); *H01L 27/14643* (2013.01); *H04N 5/378* (2013.01)

(58) Field of Classification Search
CPC ............... H04N 5/37457; H04N 5/378; H01L 27/14641; H01L 27/14643
USPC ..................................................... 250/208.1
See application file for complete search history.

(56) References Cited

U.S. PATENT DOCUMENTS

| 7,659,500 B2 * | 2/2010 | Purcell ............... H04N 5/23241 250/208.1 |
| 2008/0291309 A1 * | 11/2008 | Gruev .................. H04N 5/3658 348/308 |
| 2008/0316163 A1 * | 12/2008 | Van Den Homberg ............. G09G 3/3685 345/98 |
| 2011/0267522 A1 | 11/2011 | Gendai et al. |
| 2013/0119235 A1 * | 5/2013 | Iida ...................... H04N 5/3575 250/208.1 |

FOREIGN PATENT DOCUMENTS

| JP | 2008-022259 A | 1/2008 |
| JP | 2011-234243 A | 11/2011 |

* cited by examiner

*Primary Examiner* — Seung C Sohn
(74) *Attorney, Agent, or Firm* — McDermott Will & Emery LLP

(57) ABSTRACT

The present invention makes it possible to read a pixel signal at high speed. A pixel array includes a plurality of pixels that store an electrical charge. The amount of stored electrical charge is based on the amount of received light. A first pixel current source and a second pixel current source are coupled in parallel between a ground voltage and a pixel output node on a pixel signal read line. A switch is disposed in a wiring path that couples the pixel output node, the second pixel current source, and the ground voltage.

10 Claims, 11 Drawing Sheets

SEMICONDUCTOR DEVICE

CROSS-REFERENCE TO RELATED APPLICATIONS

The disclosure of Japanese Patent Application No. 2014-089251 filed on Apr. 23, 2014 including the specification, drawings, and abstract is incorporated herein by reference in its entirety.

BACKGROUND

The present invention relates to a semiconductor device, and more particularly, to a semiconductor device capable of functioning as a solid-state image pickup device that reads pixels on an individual column basis.

It has been known that there is a method of enabling a solid-state image pickup device (image sensor) to perform a high-speed read operation.

A solid-state image sensing device described, for instance, in Japanese Unexamined Patent Application Publication No. 2008-022259 includes a pixel signal read line, a pixel section, and a pixel signal read section. The pixel section has an array of pixels including a photoelectric conversion element. The pixel signal read section reads a pixel signal from the pixel section through the pixel signal read line. The pixel signal read section includes a current source circuit including a load element that acts as a current source coupled to the pixel signal read line to form a source follower. The current source circuit includes a circuit that causes a current flow in accordance with a slew rate of the pixel signal read line and permits the current source to cause a current flow accordingly.

A solid-state image sensing device described, for instance, in Japanese Unexamined Patent Application Publication No. 2011-234243 includes a photoelectric conversion means and a diffusion region. The photoelectric conversion means stores a photo-charge for a plurality of pixels disposed in an imaging section in accordance with the amount of received light. The diffusion region is used to extract a signal corresponding to the photo-charge stored in the photoelectric conversion means. This solid-state image sensing device further includes a transfer transistor, an amplifying transistor, a signal line, and a current source. The transfer transistor transfers the photo-charge in the photoelectric conversion means to the diffusion region. The amplifying transistor is coupled to the diffusion region. The signal line is coupled to the output side of the amplifying transistor. The current source is coupled to the signal line. At least one transistor for controlling the output waveform of the amplifying transistor is coupled to the current source.

SUMMARY

However, methods described in Japanese Unexamined Patent Application Publications No. 2008-022259 and No. 2011-234243 cannot read a pixel signal at a sufficiently high speed.

The method described in Japanese Unexamined Patent Application Publication No. 2008-022259 attempts to achieve high speed by momentarily turning on a short-circuit path between a pixel output node and a ground in accordance with a transfer control signal TX. However, the attained high speed is insufficient because the resistance value of the short-circuit path varies. Conversely, settling deteriorates due to a downshoot. As a result, the pixel signal cannot be read at a sufficiently high speed.

The method described in Japanese Unexamined Patent Application Publication No. 2011-234243 improves settling by self-detection of insufficient settling. However, an area increase is caused by the use of a large dummy capacity. Besides, noise immunity is adversely affected because the bias voltage of a pixel current is independent on an individual column basis. This results in an increase in settling time, so that the pixel signal cannot be read at a sufficiently high speed.

Other problems and novel features will become apparent from the following description and from the accompanying drawings.

According to an aspect of the present invention, there is provided a semiconductor device including a first pixel current source, a second pixel current source, and a switch. The first and second pixel current sources are coupled in parallel between a ground voltage and a pixel output node on a pixel signal read line. The switch is disposed in a wiring path that couples the pixel output node, the second pixel current source, and the ground voltage.

The semiconductor device according to an aspect of the present invention settles the voltage of the pixel output node at high speed. Therefore, a pixel signal can be read at high speed.

DETAILED DESCRIPTION

Embodiments of the present invention will now be described with reference to the accompanying drawings.

First Embodiment

Figure 1:
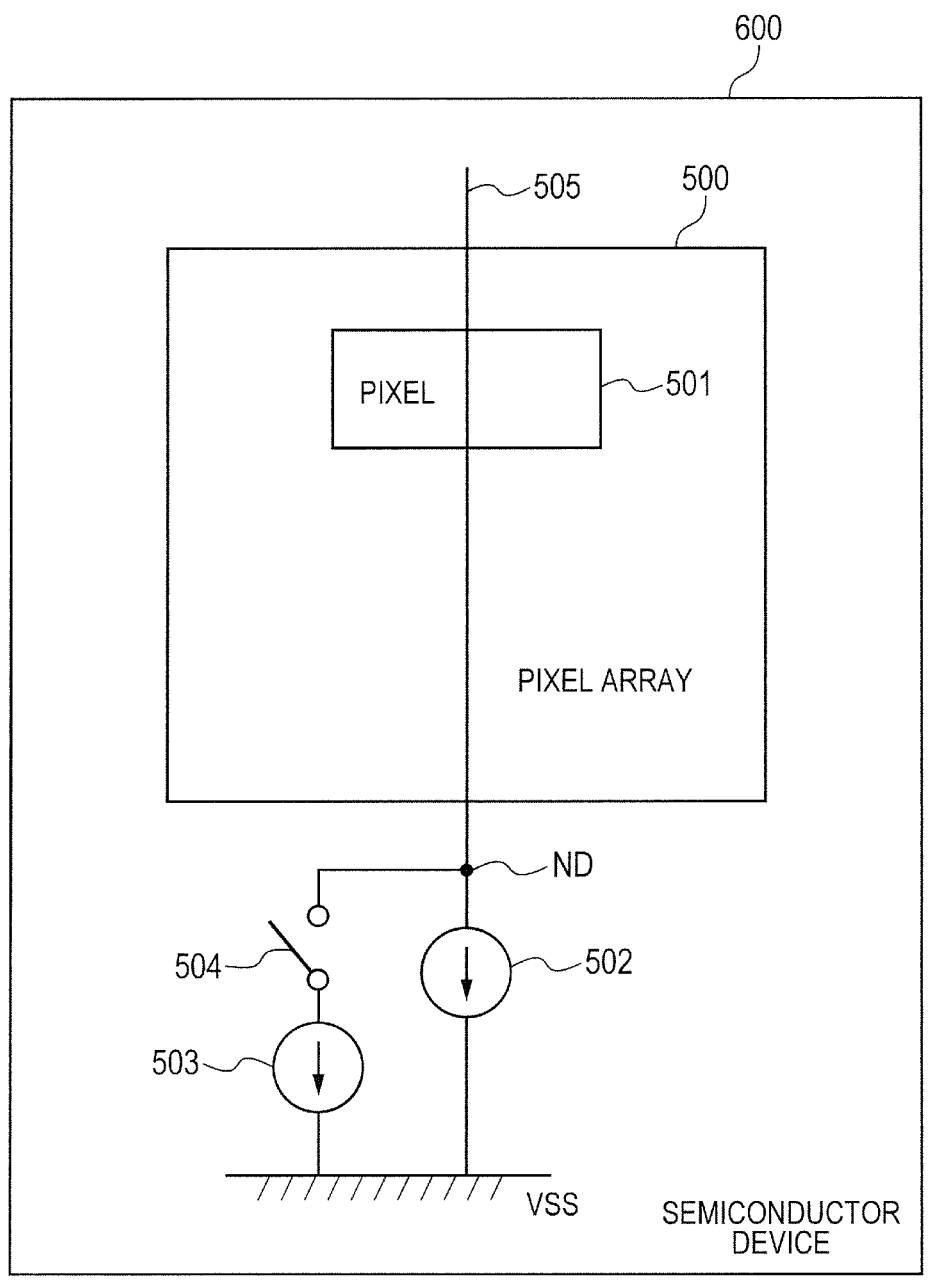
FIG. 1 is a diagram illustrating a configuration of a semiconductor device according to a first embodiment of the present invention.

FIG. 1 is a diagram illustrating a configuration of a semiconductor device according to a first embodiment of the present invention.

The semiconductor device 600 includes a pixel array 500, a pixel signal read line 505, a first pixel current source 502, a second pixel current source 503, and a switch 504.

The pixel array 500 includes a plurality of pixels 501 that store an electrical charge based on the amount of received light. The pixel signal read line 505 is coupled to the pixels 501.

The first pixel current source 502 and the second pixel current source 503 are coupled in parallel between a ground voltage VSS and a pixel output node ND in the pixel signal read line 505.

The switch 504 is disposed in a wiring path that couples the pixel output node ND, the second pixel current source 503, and the ground voltage VSS.

According to the first embodiment, when the switch 504 is on, a current output from the pixels 501 is pulled out to the ground through the two pixel current sources, namely, the first and second pixel current sources 502, 503. This makes it possible to settle the pixel output node ND at high speed.

Second Embodiment

Figure 2:
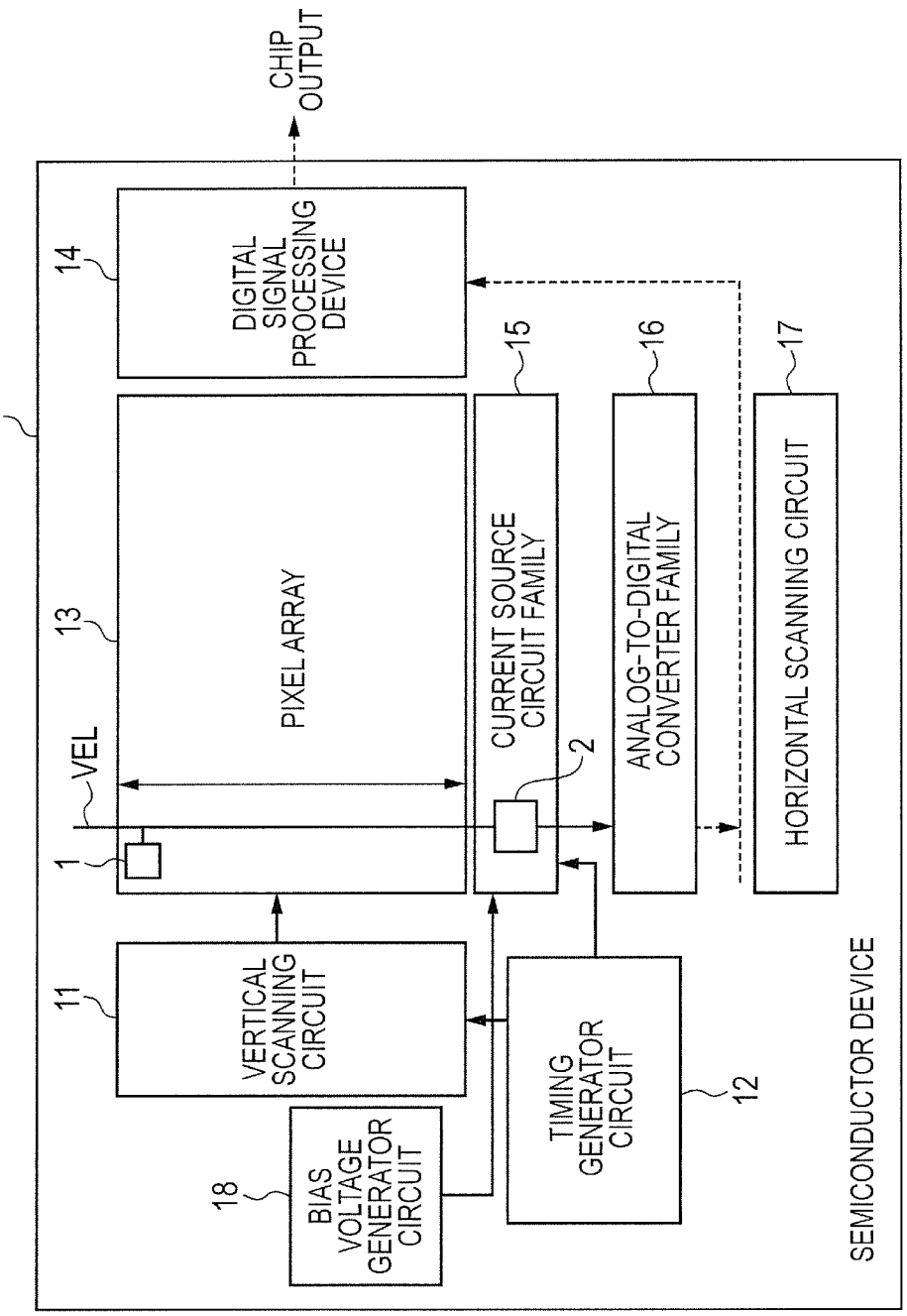
FIG. 2 is a diagram illustrating a configuration of a semiconductor device according to a second embodiment of the present invention.

FIG. 2 is a diagram illustrating a configuration of a semiconductor device according to a second embodiment of the present invention.

The semiconductor device 10 is formed of a single semiconductor chip, and includes a pixel array 13, a vertical scanning circuit 11, a pixel signal read line VEL, a current source circuit group 15, an analog-to-digital converter group 16, a horizontal scanning circuit 17, a digital signal processing device 14, a timing generator circuit 12, and a bias voltage generator circuit 18.

The pixel array 13 includes a plurality of pixels 1 that are arranged in a matrix format. The pixels 1 store an electrical charge. The amount of stored electrical charge is based on the amount of received light. The pixel signal read line 19 is wired in vertical direction and coupled to the pixels 1.

Each column of the current source circuit group 15 includes a current source circuit 2 that is coupled to the pixels 1. The timing generator circuit 12 generates various timing signals that control the operation timing of the pixel array 13 and of circuits in the current source circuit group 15, and outputs the generated timing signals to the pixel array 13 and the current source circuit group 15 through the vertical scanning circuit 11.

The bias voltage generator circuit 18 generates various bias voltages and supplies them to the current source circuit group 15.

A voltage signal read from a pixel in a row selected by the vertical scanning circuit 11 is converted to a digital equivalent by an analog-to-digital converter in the analog-to-digital converter group 16. The horizontal scanning circuit 17 sequentially selects analog-to-digital converters arranged in each column so that a digitally converted pixel signal is read by the digital signal processing device 14 and then output from the semiconductor device 10. The digitally converted pixel signal can be read at an extremely high speed. Meanwhile, the voltage signal read from a pixel is an analog signal. It is demanded that such an analog signal be read at high speed. The second embodiment increases the speed of such a read operation.

Figure 3:
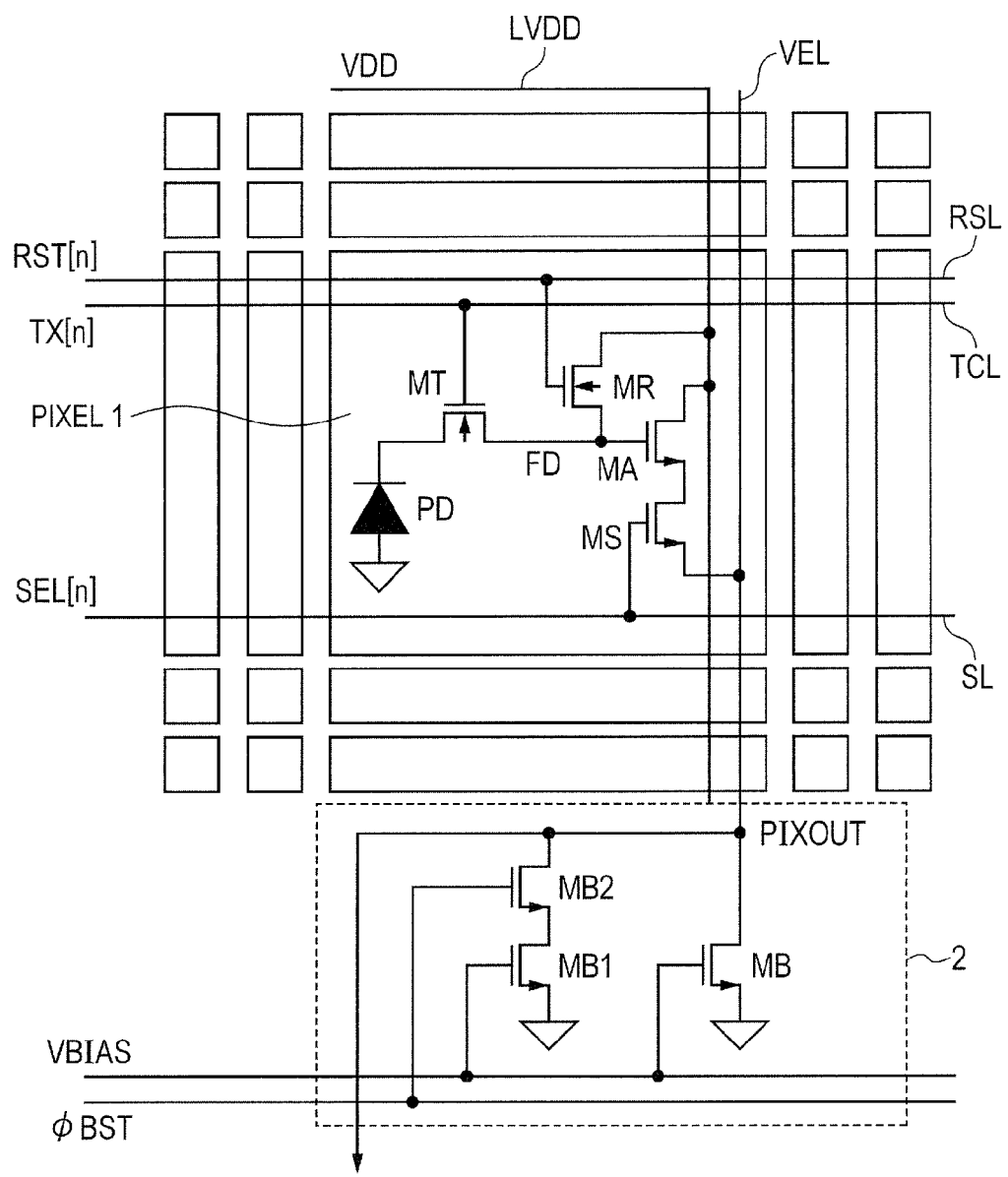
FIG. 3 is a diagram illustrating a configuration of a pixel and of a current source circuit in accordance with the second embodiment.

FIG. 3 is a diagram illustrating a configuration of a pixel and of a current source circuit in accordance with the second embodiment. FIG. 3 shows a pixel 1 in a column of the nth row of the pixel array 13.

The pixel 1 includes a photodiode PD, a transfer transistor MT, a reset transistor MR, an amplifying transistor MA, a selection transistor MS.

The photodiode PD is a photoelectric conversion element that performs photoelectric conversion to generate and store an electrical charge (electrons in the present example). The amount of stored electrical charge is based on the amount of incident light.

A floating diffusion FD generates a voltage corresponding to the electrical charge stored in the photodiode PD. The transfer transistor MT is coupled between the photodiode PD and the floating diffusion FD.

The transfer transistor MT is formed of an N-channel MOS transistor. The gate of the transfer transistor MT receives a transfer control signal TX through a transfer control line TCL and the vertical scanning circuit 11 (the transfer transistor MT in the nth row receives a transfer control signal TX[n], which is output from the vertical scanning circuit 11, under an instruction from the timing generator circuit 12). When the transfer control signal TX goes high, the transfer transistor MT operates in such a manner that the electrical charge stored in the photodiode PD is transferred to the floating diffusion FD.

The reset transistor MR is formed of an N-channel MOS transistor. The reset transistor MR is coupled between the floating diffusion FD and a power supply line LVDD that transmits a voltage VDD. The gate of the reset transistor MR receives a reset signal RST through a reset control line RSL and the vertical scanning circuit 11 (the reset transistor MR in the nth row receives a reset signal RST[n], which is output from the vertical scanning circuit 11, under an instruction from the timing generator circuit 12). When the reset signal RST goes high, the reset transistor MR operates in such a manner that the voltage of the floating diffusion FD is reset to the voltage VDD of the power supply line LVDD.

The amplifying transistor MA is formed of an N-channel MOS transistor. The amplifying transistor MA includes a gate coupled to the floating diffusion FD, a drain coupled to the power supply line LVDD, and a source.

The selection transistor MS is formed of an N-channel MOS transistor. The selection transistor MS is coupled between the pixel signal read line VEL and the source of the amplifying transistor MA. The gate of the selection transistor MS receives a selection signal SEL though a selection signal line SL (the selection transistor MS in the nth row receives a selection signal SEL[n], which is output from the vertical scanning circuit 11, under an instruction from the timing generator circuit 12).

The current source circuit 2 includes a pixel current source transistor MB, a pixel current source transistor MB1, and a switching transistor MB2. The pixel current source transistor MB, the pixel current source transistor MB1, and the switching transistor MB2 are formed of an N-channel MOS transistor.

The pixel current source transistor MB and the pixel current source transistor MB1 are coupled in parallel between the ground voltage VSS and a pixel output node PIXOUT on the pixel signal read line VEL. The gate of the pixel current source transistor MB and the gate of the pixel current source transistor MB1 receive a bias voltage VBIAS that is supplied from a bias voltage generator circuit 18.

The switching transistor MB2 is disposed in a wiring path that couples the pixel output node PIXOUT, the pixel current source transistor MB1, and the ground voltage VSS. The gate of the switching transistor MB2 receives a control signal BST that is output from the timing generator circuit 12.

When the switching transistor MB2 is off, the amplifying transistor MA and the pixel current source transistor MB form a source-follower amplifier. When the switching transistor MB2 is on, the amplifying transistor MA, the pixel current source transistor MB, and the pixel current source transistor MB1 form a source follower amplifier.

Here, the area of the photodiode PD needs to be increased in order to increase the photosensitivity of a pixel. Thus, the transistors including the amplifying transistor MA are small in size and have a small driving force. Meanwhile, a wiring for the pixel signal read line VEL of the source follower amplifier is as long as several tens of millimeters. Therefore, an increased load capacity results from the parasitic capacity of the wiring. In the present embodiment, two pixel current source transistors are incorporated to drive a large load capacity and increase the read response speed of a pixel signal.

Figure 4:
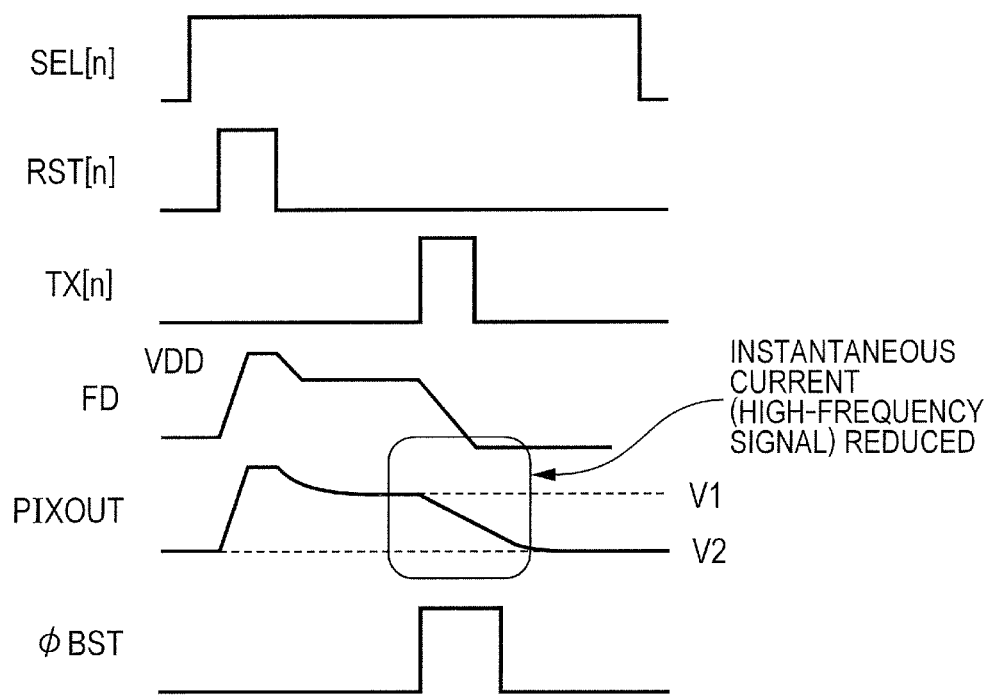
FIG. 4 is a diagram illustrating an overview of the read of a pixel in the nth row in accordance with the second embodiment.

FIG. 4 is a diagram illustrating an overview of the read of a pixel in the nth row in accordance with the second embodiment. The timing generator circuit 12 and the vertical scanning circuit 11 cause the selection signal SEL[n] to go high.

When the timing generator circuit 12 and the vertical scanning circuit 11 cause the reset signal RST[n] to rise, the node of the floating diffusion FD is reset to the voltage VDD of the power supply line LVDD by the reset transistor MR.

Next, when the timing generator circuit 12 and the vertical scanning circuit 11 cause the reset signal RST[n] to fall, the gate of the reset transistor MR injects a charge so as to decrease the potential of the floating diffusion FD by approximately several hundred millivolts.

As the selection signal SEL[n] is set at the high level, the selection transistor MS turns on. This causes the amplifying transistor MA in the nth row and the pixel current source transistor MB to form a source follower amplifier. The source follower amplifier outputs a potential corresponding to the potential of the floating diffusion FD to the pixel signal read line VEL. This changes the voltage of the pixel output node PIXOUT. In this instance, a current flows through the pixel current source transistor MB. The resulting potential of the pixel output node PIXOUT is referred to as the first potential V1.

Next, the timing generator circuit 12 and the vertical scanning circuit 11 cause the transfer control signal TX[n] to rise and stay at the high level for a predetermined period of time. As a result, the transfer transistor MT turns on and stays on for a predetermined period of time. When the transfer transistor MT turns on, an electrical charge held by the photodiode PD is transferred to the floating diffusion FD. The potential of the floating diffusion FD then decreases by a voltage of up to 1 V in accordance with light intensity.

The source follower amplifier formed by the amplifying transistor MA and the pixel current source transistor MB outputs a potential corresponding to the potential of the floating diffusion FD to the pixel signal read line VEL. This changes the voltage of the pixel output node PIXOUT. In this instance, a current flows through the pixel current source transistor MB. However, as the pixel signal read line VEL is long, a current flowing through only the pixel current source transistor MB causes the pixel output node PIXOUT to change at a low speed. This results in a long settling time.

As such being the case, the present embodiment is configured so that the timing generator circuit 12 causes the control signal φBST to go high at a timing at which the timing generator circuit 12 and the vertical scanning circuit 11 cause the transfer control signal TX[n] to rise. The switching transistor MB2 then turns on so that a current also flows through the pixel current source transistor MB1. This causes the slew rate to increase so that the voltage of the pixel output node PIXOUT is settled at high speed.

After the timing generator circuit 12 and the vertical scanning circuit 11 cause the transfer control signal TX[n] to go low, the timing generator circuit 12 causes the control signal φBST to go low before the voltage output from a pixel 1 is governed by a small signal response. This prevents a current from flowing to the pixel current source transistor MB1. This contributes to low power consumption. The resulting potential of the pixel output node PIXOUT is referred to as the second potential V2.

The first potential V1 and the second potential V2 are forwarded to succeeding circuits (analog-to-digital converter and digital signal processing device). The difference between the first potential V1 and the second potential V2 is then determined to read a signal recorded in the pixel 1.

As described above, the present embodiment can easily increase the speed of pixel output response because it incorporates two pixel current source transistors.

Further, in the present embodiment, the bias voltage VBIAS supplied to the gates of the pixel current source transistors MB, MB1 is maintained constant at all times. This makes it possible to reduce the fluctuation of the voltage of the pixel output node PIXOUT.

In the present embodiment, after the control signal φBST goes high simultaneously with the control signal TX, the control signal φBST goes low before the voltage output from a pixel 1 is governed by a small signal response. This causes the pixel current source transistor MB1 to turn off, thereby contributing to low power consumption. However, the method of reducing the power consumption is not limited to the above. An alternative is to change the rise timing and fall timing of the control signal φBST in accordance with pixel transfer characteristics.

Moreover, the bias voltage VBIAS according to the present embodiment may be shared by a plurality of columns.

Third Embodiment

As is the case with the second embodiment, a third embodiment of the present invention reduces the settling time required for the voltage of the pixel output node PIXOUT by increasing a current that is pulled out to the ground (ground voltage VSS) when the voltage from a pixel is output to the pixel signal read line VEL. In the second embodiment, a path for pulling out the current to the ground is disposed in addition to the pixel current source transistor MB in order to increase the current that is pulled out to the ground. In the third embodiment, on the other hand, the path is not increased; however, the current flowing to the pixel current source transistor MB is increased in order to increase the current that is pulled out to the ground.

Figure 5:
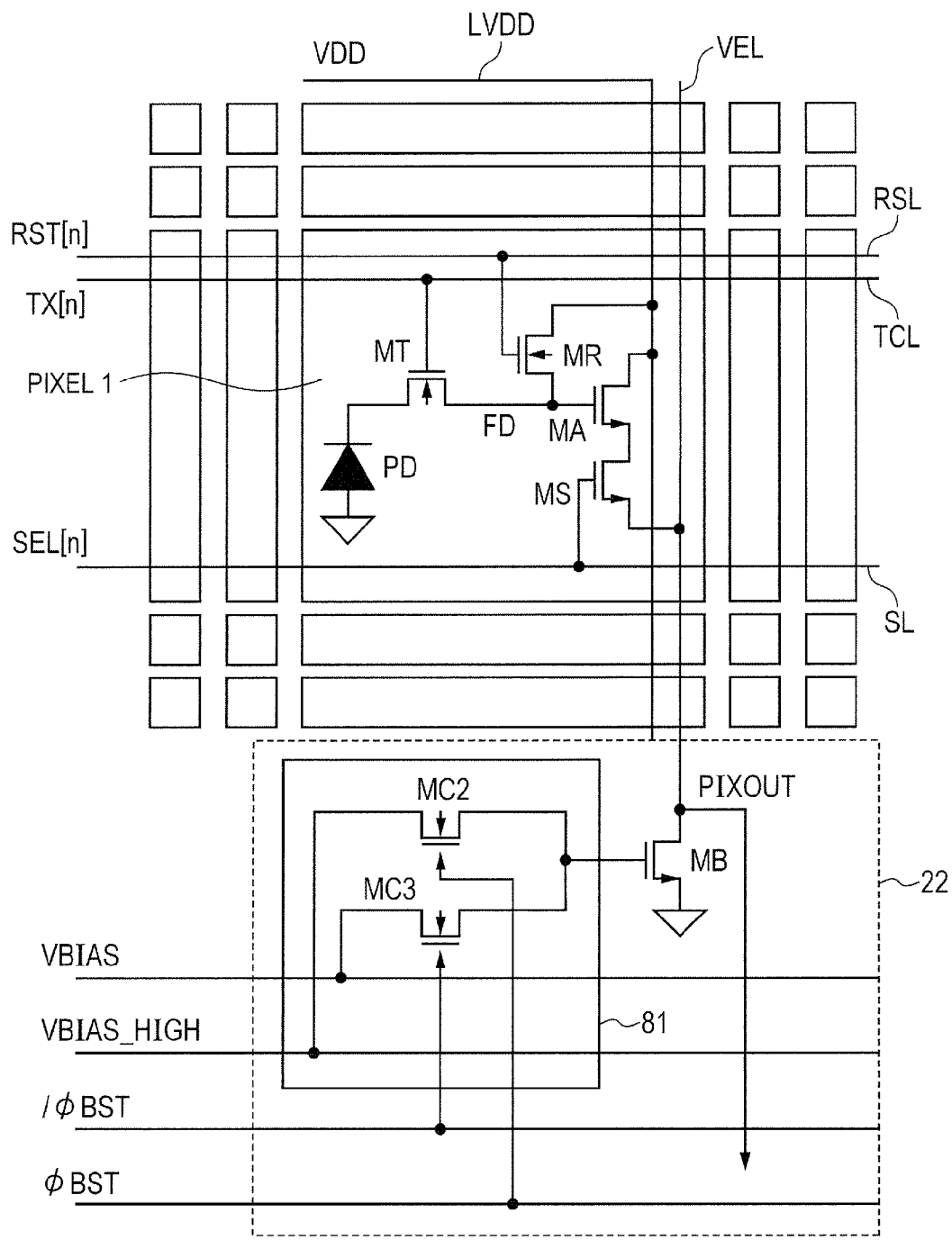
FIG. 5 is a diagram illustrating a configuration of a pixel and of a current source circuit in accordance with a third embodiment of the present invention.

FIG. 5 is a diagram illustrating a configuration of a pixel and of a current source circuit in accordance with the third embodiment. FIG. 5 shows a pixel in a column of the nth row of the pixel array 13.

The pixel 1 is the same as the pixel 1 according to the second embodiment shown in FIG. 3. The current source circuit 22 includes a pixel current source transistor MB and a switch 81. The switch 81 includes a switching transistor MC2 and a switching transistor MC3. The pixel current source transistor MB and the switching transistors MC2, MC3 are formed of an N-channel MOS transistor.

The pixel current source transistor MB is disposed between the ground voltage VSS and the pixel output node PIXOUT on the pixel signal read line VEL. The gate of the pixel current source transistor MB receives either the bias voltage VBIAS or a high bias voltage VBIAS_HIGH, which is higher than the bias voltage VBIAS.

The switching transistor MC3 is disposed between the gate of the pixel current source transistor MB and a voltage line that transmits the bias voltage VBIAS supplied from the bias voltage generator circuit 18.

The switching transistor MC2 is disposed between the gate of the pixel current source transistor MB and a voltage line that transmits the high bias voltage VBIAS_HIGH supplied from the bias voltage generator circuit 18.

The gate of the switching transistor MC2 receives the control signal $\phi$BST from the timing generator circuit 12. The gate of the switching transistor MC3 receives a control signal/$\phi$BST from the timing generator circuit 12.

A pixel signal in a row selected by the source follower amplifier formed by the amplifying transistor MA and the pixel current source transistor MB is read. In the present embodiment, a high voltage is applied to the gate of the pixel current source transistor MB in order to increase the current that flows to the ground through the pixel current source transistor MB. This increases the read response speed of a pixel signal.

The read of a pixel in the nth row in accordance with the present embodiment will now be described with reference to FIG. 4, which was used to describe the second embodiment.

The timing generator circuit 12 and the vertical scanning circuit 11 cause the selection signal SEL[n] to go high.

When the timing generator circuit 12 and the vertical scanning circuit 11 cause the reset signal RST[n] to rise, the node of the floating diffusion FD is reset to the voltage VDD of the power supply line LVDD by the reset transistor MR.

Next, when the timing generator circuit 12 and the vertical scanning circuit 11 cause the reset signal RST[n] to fall, the gate of the reset transistor MR injects a charge so as to decrease the potential of the floating diffusion FD by approximately several hundred millivolts.

As the selection signal SEL[n] is set at the high level, the selection transistor MS turns on. This causes the amplifying transistor MA in the nth row and the pixel current source transistor MB to form a source follower amplifier. The source follower amplifier outputs a potential corresponding to the potential of the floating diffusion FD to the pixel signal read line VEL. This changes the voltage of the pixel output node PIXOUT. In this instance, a current flows through the pixel current source transistor MB. As the control signal $\phi$BST is low, the switching transistor MC2 is off and the switching transistor MC3 is on. Therefore, the bias voltage VBIAS, which is relatively low, is applied to the gate of the pixel current source transistor MB. The resulting potential of the pixel output node PIXOUT is referred to as the first potential V1.

Next, the timing generator circuit 12 and the vertical scanning circuit 11 cause the transfer control signal TX[n] to rise and stay at the high level for a predetermined period of time. As a result, the transfer transistor MT turns on and stays on for a predetermined period of time. When the transfer transistor MT turns on, an electrical charge held by the photodiode PD is transferred to the floating diffusion FD. The potential of the floating diffusion FD then decreases by a voltage of up to 1 V in accordance with light intensity.

The source follower amplifier formed by the amplifying transistor MA and the pixel current source transistor MB outputs a potential corresponding to the potential of the floating diffusion FD to the pixel signal read line VEL. This changes the voltage of the pixel output node PIXOUT.

The present embodiment is configured so that the timing generator circuit 12 causes the control signal $\phi$BST to go high at a timing at which the timing generator circuit 12 and the vertical scanning circuit 11 cause the transfer control signal TX[n] to rise. This causes the switching transistor MC2 to turn on and the switching transistor MC3 to turn off. Thus, the bias voltage VBIAS_HIGH, which is relatively high, is applied to the gate of the pixel current source transistor MB. This increases the current flowing through the pixel current source transistor MB. As a result, the slew rate increases so that the voltage of the pixel output node PIXOUT is settled at high speed.

After the timing generator circuit 12 and the vertical scanning circuit 11 cause the transfer control signal TX[n] to go low, the timing generator circuit 12 causes the control signal $\phi$BST to go low before the voltage output from a pixel 1 is governed by a small signal response. The relatively low bias voltage VBIAS is then supplied to the pixel current source transistor MB. This contributes to low power consumption. The resulting potential of the pixel output node PIXOUT is referred to as the second potential V2.

The first potential V1 and the second potential V2 are forwarded to succeeding circuits (analog-to-digital converter and digital signal processing device). The difference between the first potential V1 and the second potential V2 is then determined to read a signal recorded in the pixel 1.

As described above, the present embodiment can easily increase the speed of pixel output response by selectively applying a high voltage to the gate of the pixel current source transistor.

Further, the present embodiment changes the voltage to be applied to the gate of the pixel current source transistor MB, which is at a high impedance. This makes it possible to suppress the generation of an instantaneous current and reduce noise affecting, for instance, a pixel 1.

In the present embodiment, after the control signal $\phi$BST goes high simultaneously with the control signal TX, the control signal $\phi$BST goes low before the voltage output from a pixel 1 is governed by a small signal response. This supplies the bias voltage VBIAS to the pixel current source transistor MB, thereby contributing to low power consumption. However, the method of reducing the power consumption is not limited to the above. An alternative is to change the rise timing and fall timing of the control signal $\phi$BST in accordance with pixel transfer characteristics.

The bias voltages VBIAS, VBIAS_HIGH according to the present embodiment may be shared by a plurality of columns.

Fourth Embodiment

Figure 6:
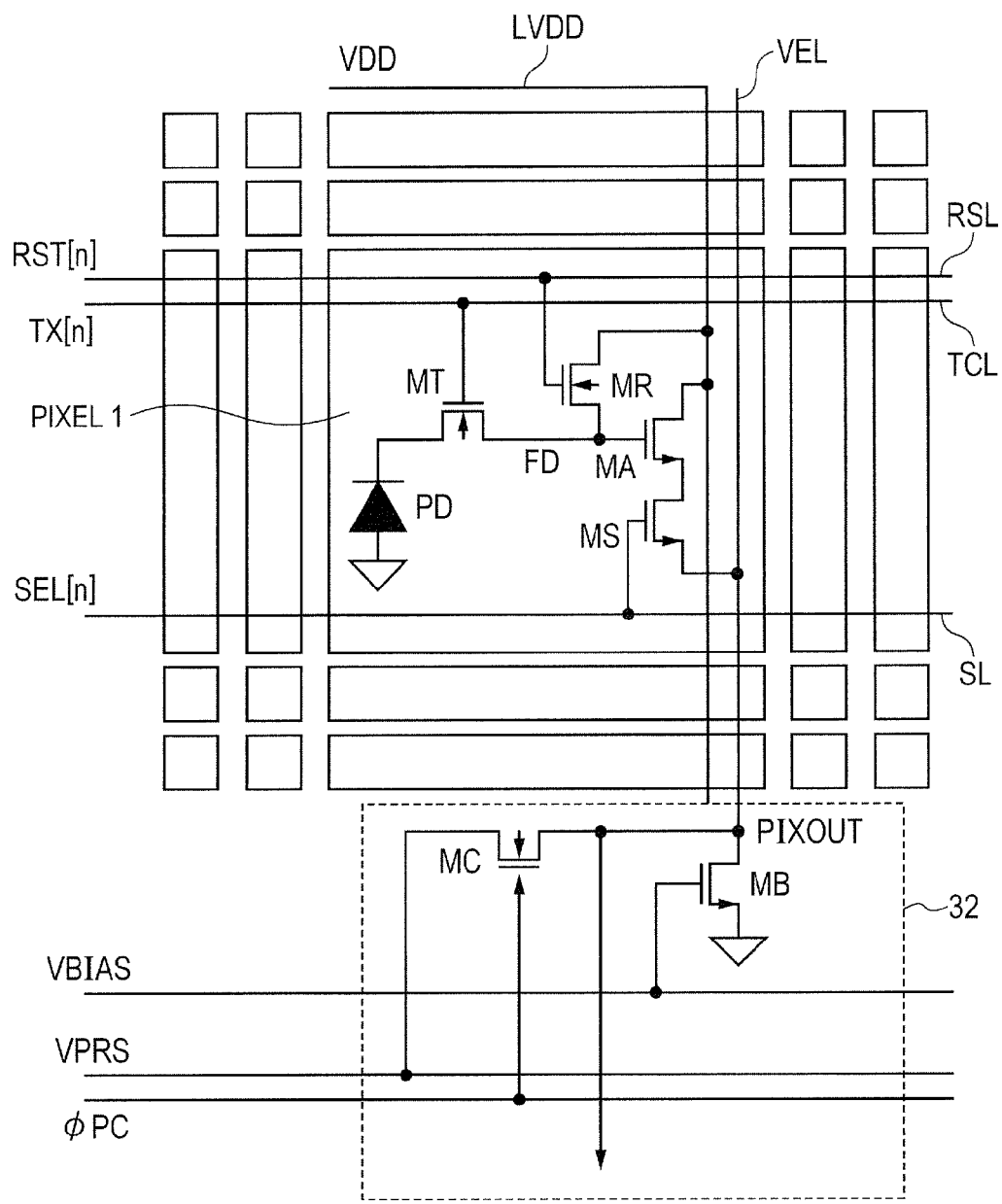
FIG. 6 is a diagram illustrating a configuration of a pixel and of a pixel current source in accordance with a fourth embodiment of the present invention.

FIG. 6 is a diagram illustrating a configuration of a pixel and of a pixel current source in accordance with a fourth embodiment of the present invention.

A current source circuit 32 includes a pixel current source transistor MB and a switching transistor MC. The pixel current source transistor MB and the switching transistor MC are formed of an N-channel MOS transistor.

The pixel current source transistor MB is disposed between the ground voltage VSS and the pixel output node PIXOUT on the pixel signal read line VEL. The gate of the pixel current source transistor MB receives the bias voltage VBIAS.

The switching transistor MC is disposed between the pixel output node PIXOUT and a voltage line that transmits a precharge voltage VPRS. The gate of the switching transistor MC receives a control signal φPC from the timing generator circuit 12.

In the present embodiment, when the voltage output to the pixel output node PIXOUT varies between a minimum voltage VMIN and a maximum voltage VMAX in accordance with the amount of electrical charge stored in the photodiode PD, the precharge voltage VPRS is equal to the minimum voltage VMIN.

Figure 7:
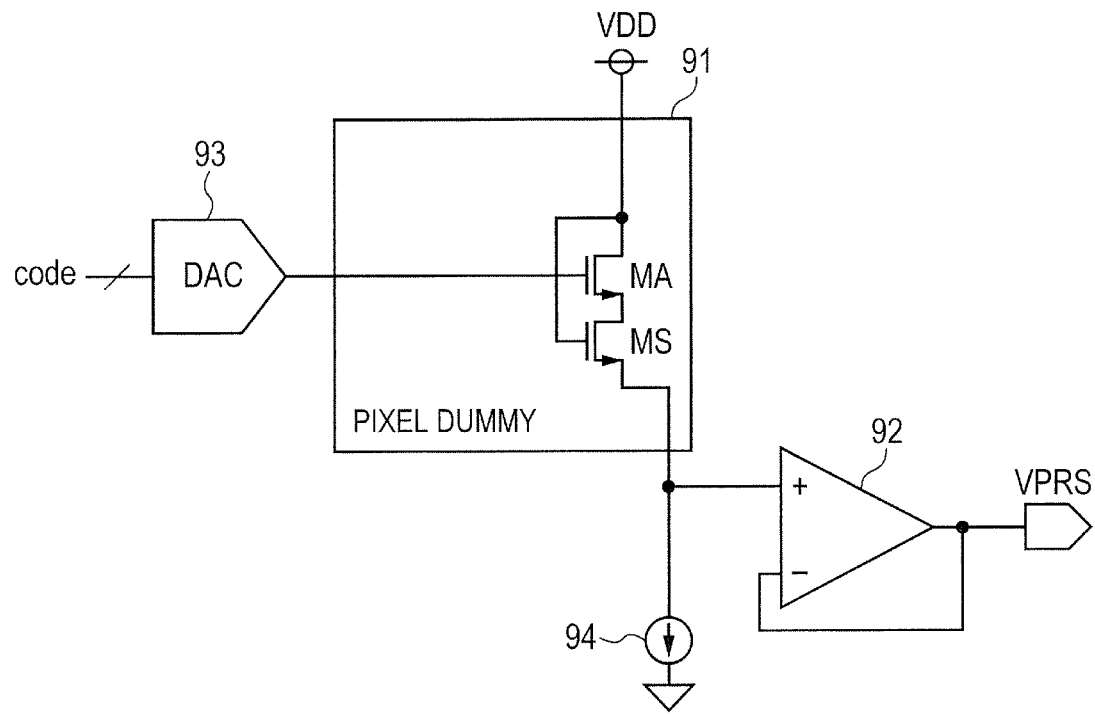
FIG. 7 is a diagram illustrating a configuration of a bias voltage generator circuit.

FIG. 7 is a diagram illustrating a configuration of the bias voltage generator circuit 18. Referring to FIG. 7, the bias voltage generator circuit 18 includes a digital-to-analog converter (DAC) 93, a pixel dummy 91, an operational amplifier 92, and a constant current source 94.

The DAC 93 converts a digital signal code to an analog signal and outputs the analog signal to the pixel dummy 91.

The pixel dummy 91 includes a transistor MA, which is disposed between the power supply voltage VDD and the ground, and a transistor MS, as is the case with the pixel 1. The transistor MA and the transistor MS are the same elements as the amplifying transistor MA and the selection transistor MS, which are included in the pixel 1.

The gate of the transistor MA receives an output from the DAC 93. The gate of the transistor MS receives the power supply voltage VDD.

A current output from the pixel dummy 91 flows to the ground through the constant current source 94. The operational amplifier 92 amplifies an output from the pixel dummy 91 to output the precharge voltage VPRS.

The bias voltage generator circuit 18 controls an input code code from the DAC 93. Thus, the magnitude of the precharge voltage VPRS can be controlled. Further, using the pixel dummy 91 makes it possible to cancel threshold value variations between one chip of the input transistor MA and another. Therefore, the magnitude of the precharge voltage VPRS can be properly set with respect to the maximum voltage VMAX and the minimum voltage VMIN without regard to the inter-chip variations.

Figure 8:
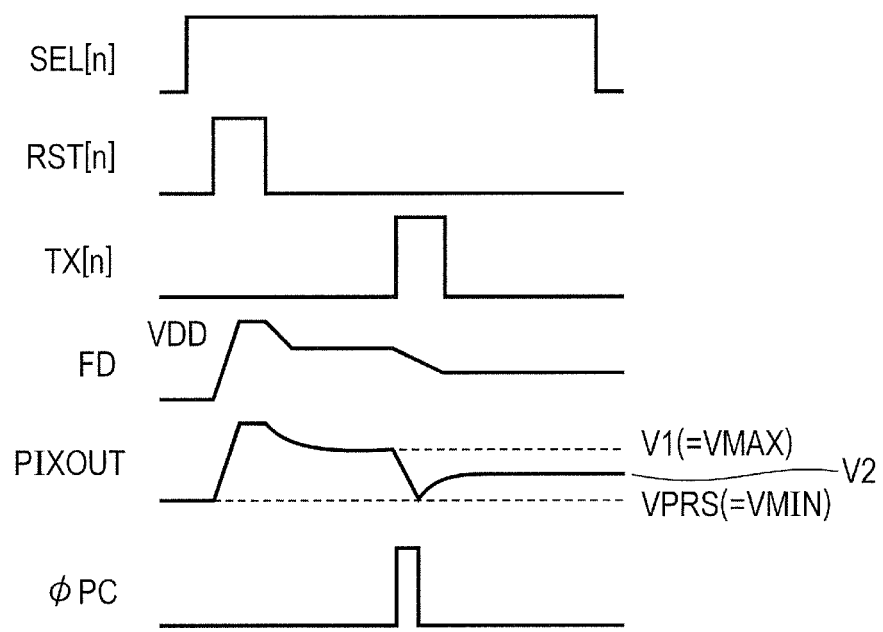
FIG. 8 is a diagram illustrating an overview of the read of a pixel in the nth row in accordance with the fourth embodiment of the present invention.

FIG. 8 is a diagram illustrating an overview of the read of a pixel in the nth row in accordance with the fourth embodiment. The timing generator circuit 12 and the vertical scanning circuit 11 cause the selection signal SEL[n] to go high.

When the timing generator circuit 12 and the vertical scanning circuit 11 cause the reset signal RST[n] to rise, the node of the floating diffusion FD is reset to the voltage VDD of the power supply line LVDD by the reset transistor MR.

Next, when the timing generator circuit 12 and the vertical scanning circuit 11 cause the reset signal RST[n] to fall, the gate of the reset transistor MR injects a charge so as to decrease the potential of the floating diffusion FD by approximately several hundred millivolts.

As the selection signal SEL[n] is set at the high level, the selection transistor MS turns on. This causes the amplifying transistor MA in the nth row and the pixel current source transistor MB to form a source follower amplifier. The source follower amplifier amplifies the potential of the floating diffusion FD and outputs the amplified potential to the pixel signal read line VEL. This changes the voltage of the pixel output node PIXOUT. In this instance, a current flows through the pixel current source transistor MB. The resulting potential of the pixel output node PIXOUT is referred to as the first potential V1.

Next, the timing generator circuit 12 and the vertical scanning circuit 11 cause the transfer control signal TX[n] to rise and stay at the high level for a predetermined period of time. As a result, the transfer transistor MT turns on and stays on for a predetermined period of time. When the transfer transistor MT turns on, an electrical charge held by the photodiode PD is transferred to the floating diffusion FD. The potential of the floating diffusion FD then decreases by a voltage of up to 1 V in accordance with light intensity.

The source follower amplifier amplifies the potential of the floating diffusion FD and outputs the amplified potential to the pixel signal read line VEL. This changes the voltage of the pixel output node PIXOUT.

The present embodiment is configured so that the timing generator circuit 12 causes the control signal φPC to go high at a timing at which the timing generator circuit 12 and the vertical scanning circuit 11 cause the transfer control signal TX[n] to rise. This causes the switching transistor MC to turn on. The pixel signal read line VEL and the pixel output node PIXOUT are then charged to the low voltage VPRS.

Subsequently, the timing generator circuit 12 causes the control signal φPC to go low before the timing generator circuit 12 and the vertical scanning circuit 11 cause the transfer control signal TX[n] to fall. The voltage of the pixel signal read line VEL and of the pixel output node PIXOUT is then changed to a voltage level corresponding to the voltage of the floating diffusion FD while the precharge voltage VPRS is used as an initial value.

The reason why the voltage of the pixel output node PIXOUT is temporarily decreased to the precharge voltage VPRS and then increased is described below. During a fall response, the source follower amplifier operates at a low speed because the slew rate is limited by a bias current flowing in the pixel current source transistor MB. During a rise response, on the other hand, the source follower amplifier operates at a high speed because the pixel current source transistor MB is driven by a current corresponding to the gate-source voltage of the amplifying transistor MA.

Further, in a situation where the voltage of the pixel output node PIXOUT varies between the minimum voltage VMIN and the maximum voltage VMAX in accordance with the voltage of the floating diffusion FD, the precharge voltage VPRS is set to the minimum voltage VMIN. This ensures that the voltage of the pixel output node PIXOUT will always increase after the transfer control signal TX[n] falls. As a result, the voltage of the pixel output node PIXOUT can be settled at high speed.

As described above, the present embodiment can increase the speed of pixel output response simply in an extremely small area when it additionally incorporates the switching transistor MC.

In the present embodiment, the control signal φPC goes high at a timing at which the transfer control signal TX[n] rises, and the same control signal φPC goes low before the transfer control signal TX[n] falls. In other words, the switching transistor MC is on during a part of a period during which the transfer transistor MT is on. However, the level change timing of the control signal φPC is not limited to the above.

For example, the timing at which the control signal φPC goes high may be earlier than the timing at which the transfer control signal TX[n] rises as far as the first potential V1 is already set. Further, the timing at which the control signal φPC goes low may also be earlier than the timing at which the transfer control signal TX[n] rises. In other words, in the above instance, the switching transistor MC is on during a period before the transfer transistor MT is on.

Moreover, the present embodiment has been described with reference to a case where the speed of settling is increased when the transfer transistor MT is turned on. However, the speed of settling can also be increased when the reset transistor MR is turned on.

Modification of Fourth Embodiment

In a modification of the fourth embodiment, the precharge voltage VPRS is set to be slightly lower than an intermediate value between the maximum voltage VMAX and the minimum voltage VMIN. More specifically, for example, the precharge voltage VPRS is set to be higher than the minimum voltage VMIN by ¼ the difference between the maximum voltage VMAX and the minimum voltage VMIN.

In the above instance, if the final voltage value of the pixel output node PIXOUT is equal to the maximum voltage VMAX, an amplitude of 75% of (VMAX−VMIN) needs to be settled. However, a high-speed response is made because a pixel output is a rising response.

If, on the other hand, the final voltage value of the pixel output node PIXOUT is equal to the minimum voltage VMIN, the response speed is low because the pixel output is a falling response. However, the amplitude to be settled is as small as ¼ of (VMAX−VMIN). As a result, the settling time is short.

Fifth Embodiment

In the fourth embodiment, if a through current flows to a pixel 1 through the selection transistor MS in the "on" state while the control signal φPC is set at the high level by the timing generator circuit 12, the switching transistor MC is set to be on, and the pixel signal read line VEL and the pixel output node PIXOUT are being precharged, the voltage of the pixel output node PIXOUT may become noisy.

Figure 9:
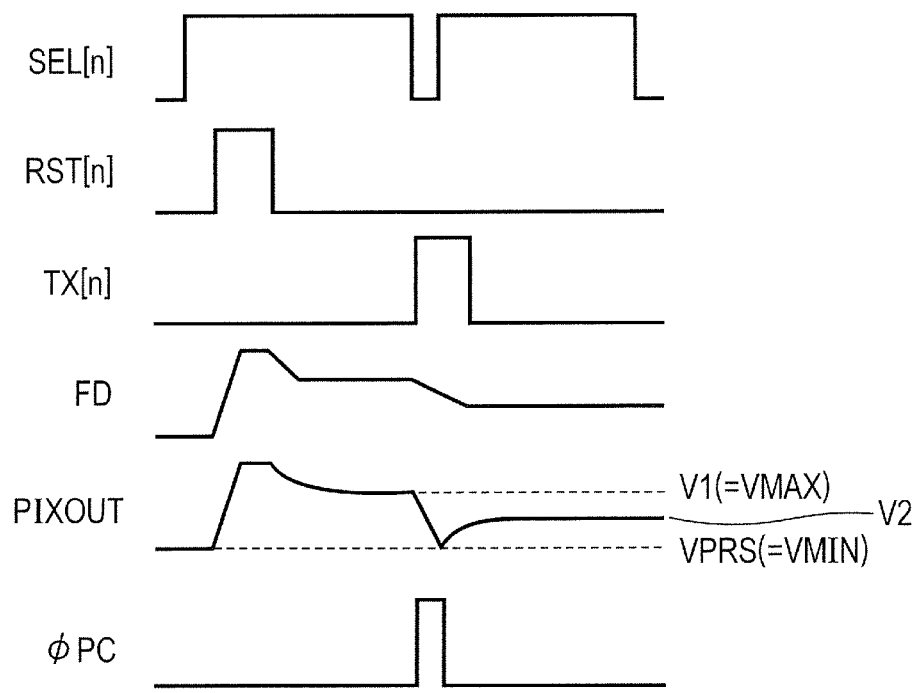
FIG. 9 is a diagram illustrating an overview of the read of a pixel in the nth row in accordance with a fifth embodiment of the present invention.

As shown in FIG. 9, while the control signal φPC is set at the high level by the timing generator circuit 12, the switching transistor MC is set to be on, and the voltage of the pixel signal read line VEL and the pixel output node PIXOUT are being precharged to the precharge voltage VPRS, a fifth embodiment of the present invention turns off the selection transistor MS by setting the selection signal SEL at the low level with the timing generator circuit 12 and the vertical scanning circuit 11.

The above opens a path between the power supply voltage VDD and the precharge voltage VPRS. This makes it possible to avoid a through current that is generated while the control signal φPC is on.

Sixth Embodiment

A sixth embodiment of the present invention automatically detects whether the voltage of the pixel output node PIXOUT is settled.

Figure 10:
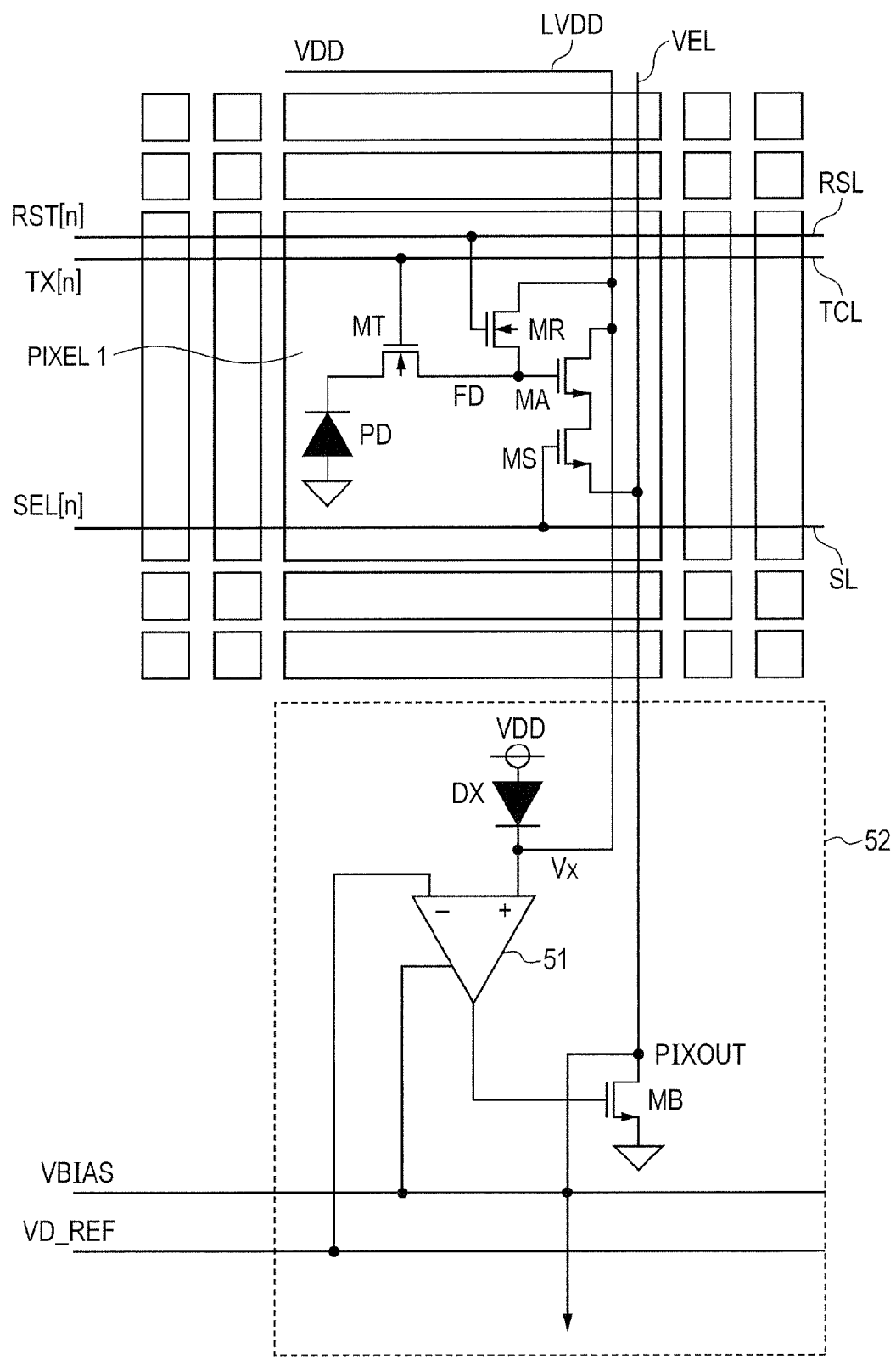
FIG. 10 is a diagram illustrating a configuration of a pixel and of a pixel current source in accordance with a sixth embodiment of the present invention.

FIG. 10 is a diagram illustrating a configuration of a pixel and of a pixel current source in accordance with the sixth embodiment. The pixel current source 52 includes a pixel current source transistor MB, a detection diode DX, and an operational amplifier 51. The pixel current source transistor MB is formed of an N-channel MOS transistor.

The pixel current source transistor MB is disposed between the ground voltage VSS and the pixel output node PIXOUT on the pixel signal read line VEL. The gate of the pixel current source transistor MB receives the bias voltage VBIAS.

The detection diode DX is disposed between the power supply voltage VDD and a drain node of the amplifying transistor MA. The source of the detection diode DX is referred to as the detection node Vx.

One input terminal of the operational amplifier 51 is coupled to the detection node Vx. The other input terminal of the operational amplifier 51 receives a reference voltage VD_REF. The output terminal of the operational amplifier 51 is coupled to the gate of the pixel current source transistor MB. If the voltage of the detection node Vx is detected by the operational amplifier 51 to detect that the output from a pixel 1 is not settled, the speed of pixel output response is increased by allowing a large transient bias current to flow.

If the pixel output node PIXOUT does not respond immediately after the transfer transistor MT turns on to significantly decrease the potential of the floating diffusion FD, the gate-source voltage of the amplifying transistor MA decreases to turn off the current flowing in the amplifying transistor MA. As the current flowing in the amplifying transistor MA turns off, a current supplied from the detection diode DX increases the potential of the detection node Vx. The operational amplifier 51 detects and amplifies the increase in the potential of the detection node Vx. As a result, a high voltage is supplied to the gate of the pixel current source transistor MB. This increases the current flowing to the pixel current source transistor MB and speeds up the falling response of the source follower amplifier.

When the pixel output node PIXOUT makes an adequate response, a current begins to flow to the amplifying transistor MA. The potential of the detection node Vx then decreases to decrease the voltage to be supplied to the gate of the pixel current source transistor MB. This turns off the current flowing in the pixel current source transistor MB. When the common mode voltage of the operational amplifier 51 is set to be equal to the bias voltage VBIAS, the gate potential of the pixel current source transistor MB when the voltage of the detection node Vx drops to coincide with the reference voltage VD_REF is equal to the bias voltage VBIAS. This causes a steady-state current to flow.

Here, when the detection diode DX formed of a sufficiently large element is disposed with respect to the amplifying transistor MA in the pixel 1, the detection node Vx makes a sufficiently faster response than the pixel output node PIXOUT.

As described above, the present embodiment automatically detects an insufficient response of an output from a pixel. Consequently, a signal from the pixel can be read at high speed without adding a control signal.

The reference voltage VD_REF may be shared by a plurality of columns so that only wiring needs to be added to each column.

Seventh Embodiment

Figure 11:
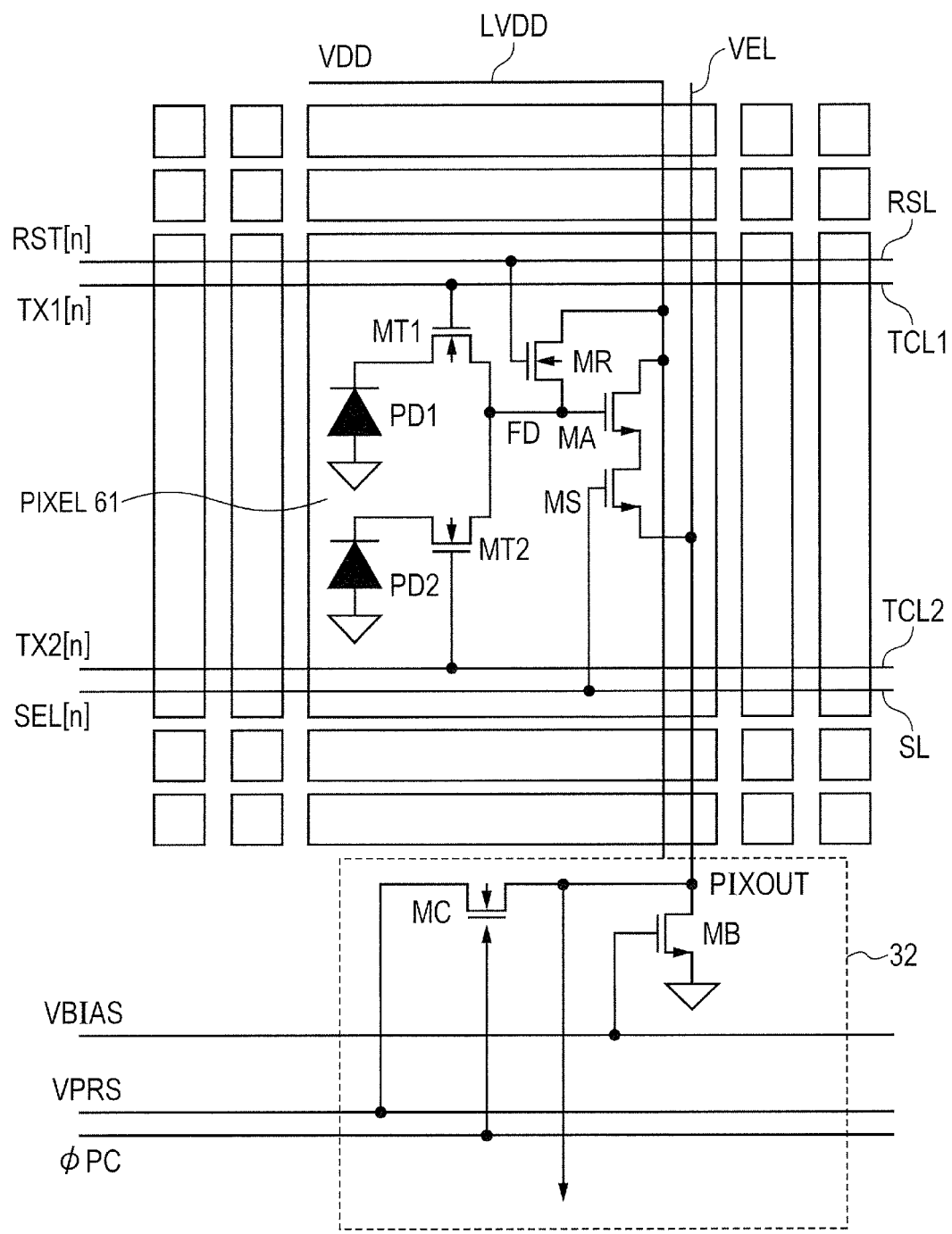
FIG. 11 is a diagram illustrating a configuration of a pixel and of a current source circuit in accordance with a seventh embodiment of the present invention.

FIG. 11 is a diagram illustrating a configuration of a pixel and of a current source circuit in accordance with a seventh embodiment of the present invention.

FIG. 11 shows a pixel 61 in a column of the nth row of the pixel array 13. The pixel 61 is configured so that the reset transistor MR, the amplifying transistor MA, the selection transistor MS, and two transfer transistors MT1, MT2 are shared by two photodiodes PD1, PD2 (2.5 transistor configuration).

The pixel 61 includes the photodiodes PD1, PD2, the transfer transistors MT1, MT2, the reset transistor MR, the amplifying transistor MA, and the selection transistor MS. The reset transistor MR, the amplifying transistor MA, and the selection transistor MS are identical with those described in conjunction with the second embodiment and will not be redundantly described.

The photodiodes PD1, PD2 are photoelectric conversion elements that perform photoelectric conversion to generate and store an electrical charge (electrons in the present example). The amount of stored electrical charge is based on the amount of incident light.

The transfer transistor MT1 is formed of an N-channel MOS transistor. The gate of the transfer transistor MT1 receives a transfer control signal TX1, which is output from the vertical scanning circuit 11, through a transfer control line TCL1 (the transfer transistor MT1 in the (2n−1)th row receives a transfer control signal TX1[n]). When the transfer control signal TX1 goes high, the transfer transistor MT1 transfers an electrical load stored in the photodiode PD1 to the floating diffusion FD.

The transfer transistor MT2 is formed of an N-channel MOS transistor. The gate of the transfer transistor MT2 receives a transfer control signal TX2, which is output from the vertical scanning circuit 11, through a transfer control line TCL2 (the transfer transistor MT1 in the 2nth row receives a transfer control signal TX2[n]). When the transfer control signal TX2 goes high, the transfer transistor MT2 transfers an electrical load stored in the photodiode PD2 to the floating diffusion FD.

Figure 12:
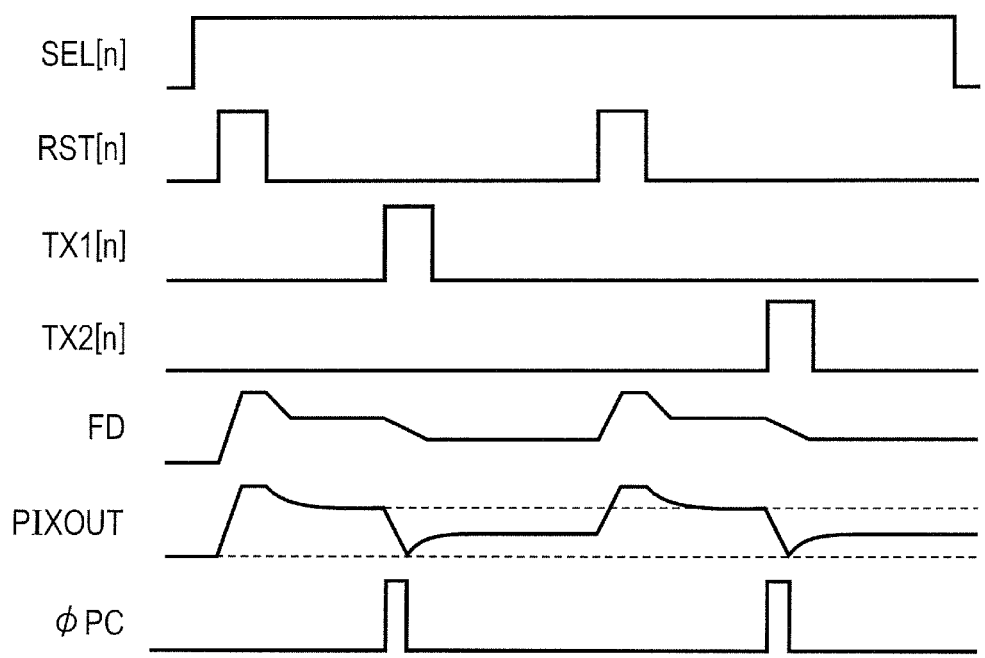
FIG. 12 is a diagram illustrating an overview of the read of a pixel in the nth row in accordance with the seventh embodiment.

The current source circuit 32 is identical with that is described in conjunction with the fourth embodiment and will not be redundantly described. FIG. 12 is a diagram illustrating an overview of the read of a pixel in the nth row in accordance with the seventh embodiment.

As shown in FIG. 12, turning on the control signal φPC in accordance with the transfer control signal TX1[n] in the (2n−1)th row and with the transfer control signal TX2 in the 2nth row makes it possible to increase the speed of a pixel signal read in each row. The other operations are the same as those described in conjunction with the fourth embodiment and will not be redundantly described.

The present embodiment has been described with reference to a case where a pixel having the 2.5 transistor configuration is read at high speed by using the method described in conjunction with the fourth embodiment. However, the high-speed read of a pixel having the 2.5 transistor configuration is not limited to the use of the above-mentioned method. A pixel having the 2.5 transistor configuration can also be read at high speed by using the method described in conjunction with the first to third embodiments, the fifth embodiment, or the sixth embodiment.

Further, even when a pixel having a 1.75 transistor configuration employed so that the reset transistor MR, the amplifying transistor MA, the selection transistor MS, and four transfer transistors are shared by four photodiodes, the pixel can be read at high speed by using the methods described in conjunction with the first to sixth embodiments.

The forgoing embodiments have been described on the assumption that the transistors MB, MB1, MB2, MC, MC2, MC3 are formed of an N-channel MOS transistor. However, the transistors may alternatively be formed of a P-channel MOS transistor. Moreover, the transistors MB1, MC, MC2, MC3, which are used as a switch, may alternatively be formed of a transfer gate transistor.

While the embodiments of the present invention contemplated by its inventors have been described in detail, the present invention is not limited to the specific embodiments described above. It is to be understood that various variations and modifications of the present invention may be made without departing from the spirit and scope of the present invention.

What is claimed is:

1. A semiconductor device comprising:
   a pixel array having a plurality of pixels that store an electrical charge based on the amount of received light;
   a pixel signal read line that is coupled to the pixels;
   a first pixel current source and a second pixel current source that are coupled in parallel between a ground voltage and a pixel output node on the pixel signal read line; and
   a switch that is disposed in a wiring path that couples the pixel output node, the second pixel current source, and the ground voltage.

2. The semiconductor device according to claim 1, wherein each of the pixels includes:
   a photoelectric conversion element that stores an electrical charge based on the amount of received light;
   a diffusion section that generates a voltage corresponding to the electrical charge stored in the photoelectric conversion element;
   a transfer transistor that transfers the electrical charge stored in the photoelectric conversion element to the diffusion section; and
   an amplifying transistor that has a gate coupled to the diffusion section, a drain coupled to a power supply voltage line, and a source, and
   wherein the semiconductor device further includes a control section that causes the transfer transistor to turn on and stay on for a predetermined period of time and turns on the switch during a period including at least the period during which the transfer transistor is on.

3. A semiconductor device comprising:
   a pixel array having a plurality of pixels that store an electrical charge based on the amount of received light;
   a pixel signal read line that is coupled to the pixels;
   a pixel current source that is disposed between a ground voltage and a pixel output node on the pixel signal read line; and
   a switch that is coupled to a control electrode of the pixel current source;
   wherein the switch applies either a first bias voltage or a second bias voltage to the control electrode, the second bias voltage being higher than the first bias voltage.

4. The semiconductor device according to claim 3, wherein each of the pixels includes:
   a photoelectric conversion element that stores an electrical charge based on the amount of received light;
   a diffusion section that generates a voltage corresponding to the electrical charge stored in the photoelectric conversion element;
   a transfer transistor that transfers the electrical charge stored in the photoelectric conversion element to the diffusion section; and
   an amplifying transistor that has agate coupled to the diffusion section, a drain coupled to a power supply voltage line, and a source, and
   wherein the semiconductor device further includes a control section that causes the transfer transistor to turn on and stay on for a predetermined period of time and controls the switch so as to apply the second bias voltage to the control electrode during a period including at least the period during which the transfer transistor is on.

5. A semiconductor device comprising:
a pixel array having a plurality of pixels that store an electrical charge based on the amount of received light;
a pixel signal read line that is coupled to the pixels;
a pixel current source that is disposed between a ground voltage and a pixel output node on the pixel signal read line; and
a switch that is disposed between the pixel output node and a precharge voltage.

6. The semiconductor device according to claim 5, wherein each of the pixels includes:
a photoelectric conversion element that stores an electrical charge based on the amount of received light;
a diffusion section that generates a voltage corresponding to the electrical charge stored in the photoelectric conversion element;
a transfer transistor that transfers the electrical charge stored in the photoelectric conversion element to the diffusion section;
an amplifying transistor that has agate coupled to the diffusion section, a drain coupled to a power supply voltage line, and a source; and
a selection transistor that is disposed between the pixel signal read line and the source of the amplifying transistor, and
wherein the semiconductor device further includes a control section that causes the transfer transistor to turn on and stay on for a predetermined period of time and turns on the switch during a portion of the period during which the transfer transistor is on or during a period before the transfer transistor turns on.

7. The semiconductor device according to claim 6, wherein the control section turns off the selection transistor during a period during which the switch is on.

8. The semiconductor device according to claim 6, wherein, when a voltage output to the pixel output node varies between a minimum voltage and a maximum voltage in accordance with the amount of electrical charge stored in the photoelectric conversion element, the precharge voltage is equal to the minimum voltage.

9. The semiconductor device according to claim 6, wherein, when a voltage output to the pixel output node varies between a minimum voltage and a maximum voltage in accordance with the amount of electrical charge stored in the photoelectric conversion element, the precharge voltage is higher than the minimum voltage by ¼ the difference between the maximum voltage and the minimum voltage.

10. A semiconductor device comprising:
a pixel array having a plurality of pixels that store an electrical charge based on the amount of received light, the pixels each including: a photoelectric conversion element that stores the electrical charge based on the amount of received light; a diffusion section that generates a voltage corresponding to the electrical charge stored in the photoelectric conversion element; a transfer transistor that transfers the electrical charge stored in the photoelectric conversion element to the diffusion section; and an amplifying transistor that has a gate coupled to the diffusion section, a drain coupled to a power supply voltage line, and a source;
a pixel signal read line that is coupled to the pixels;
a pixel current source that is disposed between a ground voltage and a pixel output node on the pixel signal read line;
a diode element that is disposed between a power supply voltage and a detection node coupled to the drain of the amplifying transistor through the power supply voltage line; and
an amplifier that amplifies the difference between a reference voltage and the voltage of the detection node;
wherein an output from the amplifier is input to a control electrode of the pixel current source.

* * * * *